(12) United States Patent
Chi et al.

(10) Patent No.: US 6,316,166 B1
(45) Date of Patent: Nov. 13, 2001

(54) METHOD OF FORMING MICRO PATTERN OF SEMICONDUCTOR DEVICE

(75) Inventors: Sung Hon Chi; Jae Hee Ha, both of Chungcheongbuk-do (KR)

(73) Assignee: Hyundai Electronics Industries Co., Ltd., Ichon (JP)

( * ) Notice: Subject to any disclaimer, the term of this patent is extended or adjusted under 35 U.S.C. 154(b) by 0 days.

(21) Appl. No.: 09/342,901

(22) Filed: Jun. 30, 1999

(30) Foreign Application Priority Data

Jun. 30, 1998 (KR) .................................................. 98/25924

(51) Int. Cl.⁷ ........................................................ G03F 7/00
(52) U.S. Cl. ............................ 430/313; 430/317; 216/41; 216/72
(58) Field of Search ..................................... 430/311, 313, 430/316, 317, 318; 216/41, 72

(56) References Cited

U.S. PATENT DOCUMENTS

| | | | |
|---|---|---|---|
| 5,023,203 | * | 6/1991 | Choi ...................................... 437/228 |
| 5,445,710 | * | 8/1995 | Hori et al. .......................... 156/643.1 |
| 5,707,487 | * | 1/1998 | Hori et al. ........................ 156/659.11 |
| 5,753,418 | | 5/1998 | Tsai et al. ............................. 430/313 |
| 6,027,861 | * | 2/2000 | Yu et al. ............................... 430/316 |
| 6,030,882 | * | 2/2000 | Hong ..................................... 438/433 |
| 6,071,824 | * | 6/2000 | Singh et al. .......................... 438/717 |
| 6,090,674 | * | 7/2000 | Hsieh et al. .......................... 438/301 |
| 6,093,973 | * | 7/2000 | Ngo et al. ............................. 257/797 |
| 6,110,837 | * | 8/2000 | Linliu et al. .......................... 438/723 |

\* cited by examiner

*Primary Examiner*—Kathleen Duda
(74) *Attorney, Agent, or Firm*—Fleshner & Kim, LLP

(57) ABSTRACT

Provided with a method of forming a micro pattern of semiconductor devices including the steps of: forming a hard mask layer on a layer to be etched; depositing and patterning a photoresist on the hard mask layer to form a photoresist pattern having a first line width; etching the photoresist pattern and the hard mask layer at once to form a hard mask layer pattern having a second line width smaller than the first line width; and selectively removing the layer to be etched by using the hard mask layer pattern as a mask to form the micro pattern.

20 Claims, 4 Drawing Sheets

METHOD OF FORMING MICRO PATTERN OF SEMICONDUCTOR DEVICE

BACKGROUND OF THE INVENTION

1. Field of the Invention

Figure 1A:
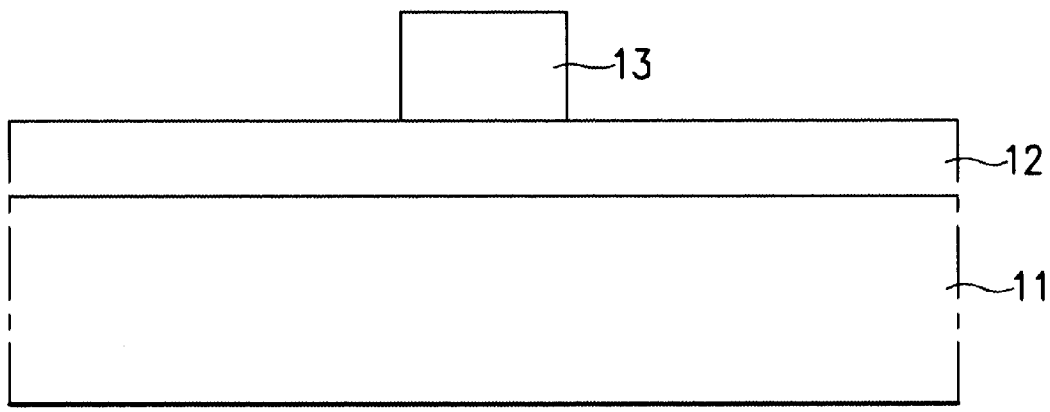

The present invention relates to a process for fabricating a semiconductor device and, more particularly, to a method of forming a micro pattern of semiconductor devices which is suitable to have a line width less than 0.1 $\mu$m.

2. Discussion of Related Art

Semiconductor chips, that is, integrated circuits (ICs) have been developed with the development of techniques in the process of micro circuits.

As semiconductor devices have a more complicated structure due to large integration and high performance, it is increasingly needed to use a technique for forming a micro pattern on the semiconductor devices.

The development of such a technique for micro circuits enabled integration of more circuits and made it possible to enhance the processing capacity through reduction of delayed time as well as resulting in larger integration and capacity of chips.

Although the techniques in the 1950s when a semiconductor chip was developed for the first time have realized a micro circuit of 15 $\mu$m, there are commercially available chips having a circuit line width less than 0.35 $\mu$m as well as sub-micron chips of below 0.5 $\mu$m in recent.

Especially, it is required to use a technique for patterning a micro circuit having a line width less than 0.2 $\mu$m with a view to performing a process for DRAMs of above Giga byte level and one having a line width of below 0.12 $\mu$m to perform a process for DRAMs of 4 Giga byte level.

A development of the technique in the process for micro circuits enabled integration of chips that are increased in number by about two times every two years, and such an inclination is expected to be accelerated in the future.

The most basic technique in the process for micro circuits is lithography, which is classified into photolithography, electron beam lithography and X-ray lithography.

Generally, a g-line photo stepper having an output wavelength of 436 nm is used for the design rule in which the line width is greater than 0.7 $\mu$m, while an i-line photo stepper having an output wavelength of 365 nm is used for sub-micron design rule.

An excimer stepper using a phase shift mask technique in which the phase of light is changed by about 180° is utilized in the lithography of sub-micron level.

It is indispensable to use a photomask for selectively transmitting a light for the sake of scanning the pattern in the photolithography which is a technique using ultraviolet rays as a source of light for exposure process.

The light passed through the photomask arrives at the photoresist, forming a latent image on the photoresist. A photoresist pattern is then formed in the subsequent exposure process. This photoresist pattern is used as a mask in an etching process to form a device in a desired pattern.

The photoresist is formed from a mixture having such a property that the internal structure is changed with an exposure to energy of various forms such as light or heat. This photoresist is classified into two categories, positive and negative photoresists.

When the negative photoresist is exposed to the light, the bonding structure in the irradiated portion is hardened into a mesh structure and the portion not exposed to the light is removed in the development process. The positive photoresist refers to a photoresist in which the bonding structure in the portion exposed to the light is loosened.

Etching a pattern by use of such a photoresist pattern may cause various problems in the actual devices. One of the problems lies in that the thickness of the photoresist becomes abnormal in the rough portion on the surface of the device having a large step difference, or that conditions for the exposure are not optimized. Furthermore, a decrease in the thickness of the photoresist for the sake of definition of the pattern may cause pin holes.

Hereinafter, a method of forming a micro pattern of semiconductor devices according to prior art will be described with reference to the accompanying drawings.

FIGS. 1a–1d are cross-sectional views for illustrating the method of forming a micro pattern of semiconductor devices according to the prior art.

As shown in FIG. 1a, a hard mask layer 12 is formed on a layer 11 to be etched so as to form a micro pattern.

After deposition of a photoresist on the hard mask layer 12, exposure and development are performed to pattern the photoresist and form a photoresist pattern 13 having the minimum line width.

The minimum line width of the photoresist pattern 13 patterned with current exposure equipment is greater than 0.25 $\mu$m.

Figure 1B:
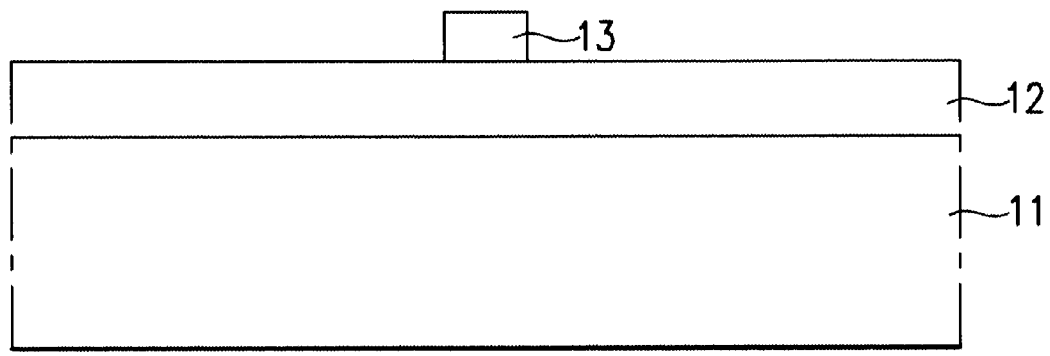

As shown in FIG. 1b, the photoresist pattern 13 is subjected to an oxygen ($O_2$) ashing process to form a pattern having a line width (0.2 $\mu$m) smaller than that of the photoresist pattern 13.

The line width of the photoresist pattern 13 is reduced by about 0.05 $\mu$m by the oxygen asing process. That means, the line width of the photoresist 13 after the oxygen asing process is about 0.2 $\mu$m.

Figure 1C:
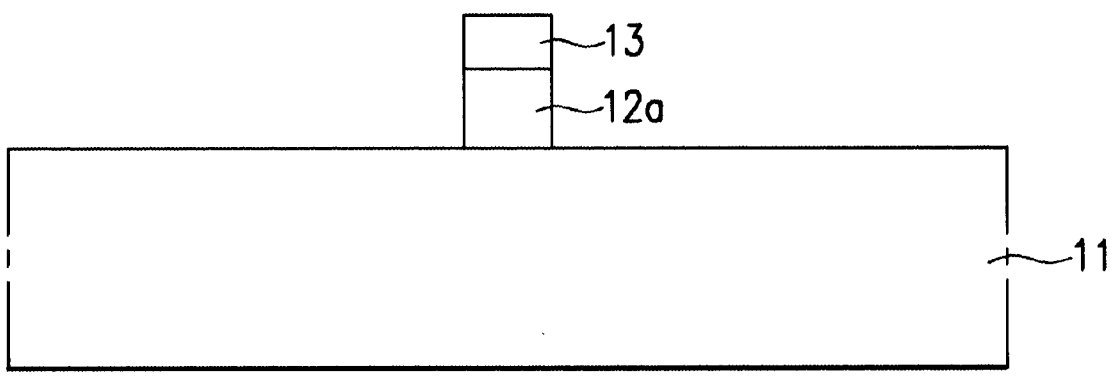

As shown in FIG. 1c, the photoresist pattern 13 is used as a mask in removing the hard mask layer 12 to form an underlying pattern 12a.

The line width of the underlying pattern 12a is 0.2 $\mu$m as same as that of the photoresist 13.

Figure 1D:
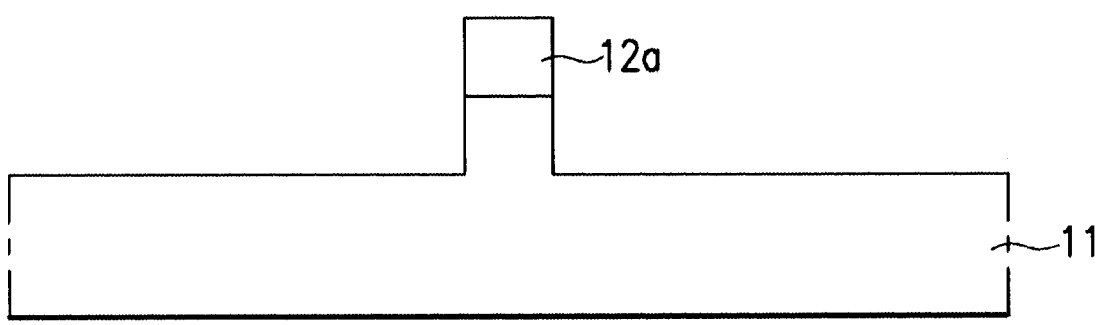

As shown in FIG. 1d, the photoresist pattern 13 is removed. The underlying pattern 12a is used as a mask in selectively removing the layer 11 to be etched, forming a micro pattern of the prior art.

In the method of forming a micro pattern of semiconductor devices according to the prior art, however, there are some problems as follows.

First, an additional process is required such as oxygen asing process for reducing the line width of the pattern photoresist. Thus the entire process becomes too complicated.

Second, it is needed to use a hard mask layer that has a high selectivity ratio with respect to the photoresist in etching the hard mask layer by use of the photoresist as a mask, because the thickness and line width of the photoresist are both reduced in the oxygen asing process. Such a decrease in the thickness of the photoresist that is used as a mask makes it impossible to etch the hard mask layer in a desired profile.

SUMMARY OF THE INVENTION

Accordingly, an object of the present invention is to provide a method of forming a micro pattern of semiconductor devices which is designed to simplify the process and form a micro pattern having a line width less than 0.1 $\mu$m.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a micro pattern of semiconductor devices includes the steps of: forming a hard mask layer on a layer to be etched; depositing and patterning a photoresist on the hard mask layer to form a photoresist pattern having a first line width; etching the photoresist pattern and the hard mask layer at once to form a hard mask layer pattern having a second line width smaller than the first line width; and selectively removing the layer to be etched by using the hard mask layer pattern as a mask to form the micro pattern.

It is to be understood that both the foregoing general description and the following detailed description are exemplary and explanatory and are intended to provide further explanation of the invention as claimed.

BRIEF DESCRIPTION OF THE ATTACHED DRAWINGS

Figure 2A:
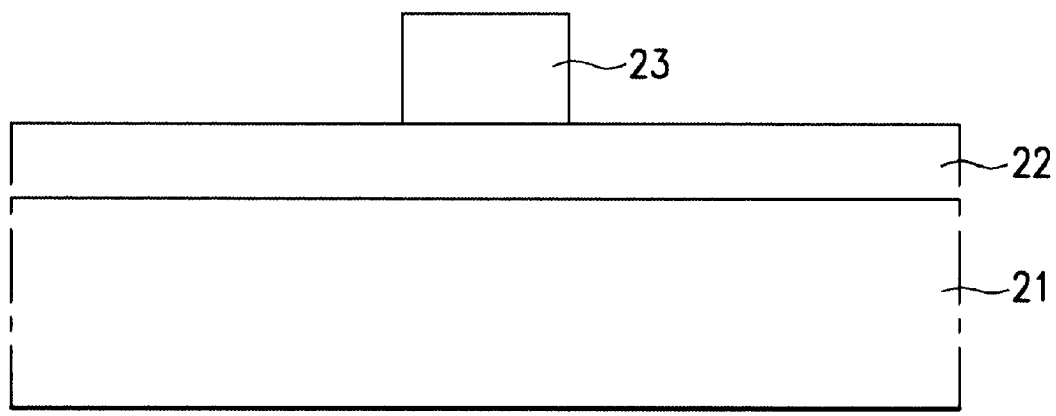
Figure 2B:
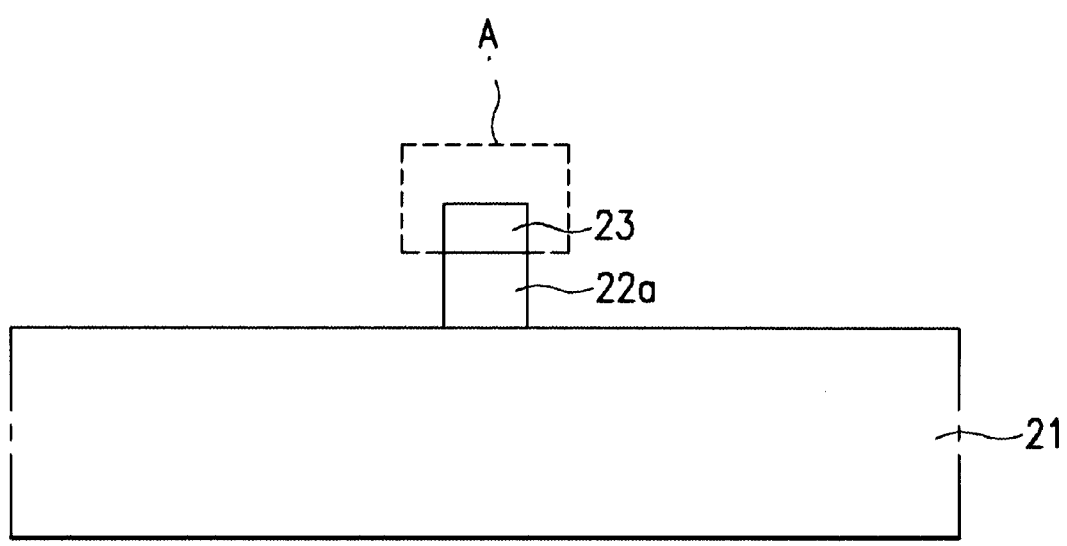
Figure 2C:
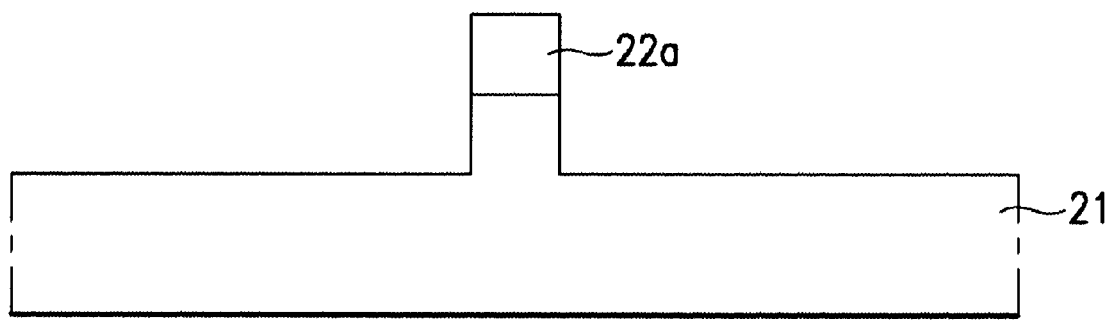

The accompanying drawings, which are included to provide a further understanding of the invention and are incorporated in and constitute a part of this specification, illustrate embodiments of the invention and together with the description serve to explain the principles of the invention:

In the drawings:

FIGS. 1a–1d are cross-sectional views for illustrating a method of forming a micro pattern of semiconductor devices according to prior art; and FIGS. 2a–2c are cross-sectional views for illustrating a method of forming a micro pattern of semiconductor devices according to the present invention.

DETAILED DESCRIPTION OF PREFERRED EMBODIMENT

Hereinafter, a method of forming a micro pattern of semiconductor devices according to the present invention will be described below with reference to the accompanying drawings.

FIGS. 2a–2c are cross-sectional views for illustrating the method of forming a micro pattern of semiconductor devices according to the present invention.

As shown in FIG. 2a, a hard mask layer 22 is formed on a layer 21 to be etched.

The hard mask layer 22 used herein consists of silicon oxide or silicon nitride.

After deposition of a photoresist on the hard mask layer 22, exposure and development are performed to pattern the photoresist and form a photoresist pattern 23.

The minimum line width of the photoresist pattern 23 patterned with current exposure equipment is about 0.25 $\mu$m.

As shown in FIG. 2b, the photoresist pattern 23 and the hard mask layer 22 are etched simultaneously to form a hard mask layer pattern 22a having a line width smaller than that of the photoresist pattern 23.

The line width of the photoresist 23 is also reduced in forming the hard mask layer pattern 22a. The line width of the hard mask layer pattern 22a is less than 0.1 $\mu$m.

On the other hand, etching equipment used to form the hard mask layer pattern 22a having a line width smaller than the photoresist pattern 23 is reactive ion etcher (RIE), magnetically enhanced reactive ion etcher (MERIE), high density plasma etcher (HDP) and the like that are controllable for ion density and ion energy in the plasma.

The etching conditions in using an HDP, the etching gas is a mixture gas of $CF_4$, $CHF_3$ and Ar, the source power 1000~2500 W, the bias power 200~1000 W, the chamber pressure 1~10 mT, the chamber temperature −10~50° C.

The ratio of $CF_4$ is 10~50% with respect to $CHF_3$.

Unexplained part "A" indicates a selectively removed portion of the photoresist pattern 23 in etching the photoresist pattern 23 and the hard mask layer 22 at once.

As shown in FIG. 2c, the residual photoresist pattern 23 is removed. The underlying pattern 22a is used as a mask in selectively removing the layer 11 to be etched, forming a micro pattern having a line width less than 0.1 $\mu$m in accordance with the present invention.

Such as in the present invention described above, the present invention method of forming a micro pattern of semiconductor devices has the following advantages.

First, an additional process is not required in reducing the line width of the photoresist in order to form the underlying pattern because the hard mask layer pattern has a line width smaller than the minimum line width by etching the photoresist pattern having the minimum line width (about 0.25 $\mu$m) and the hard mask layer at once. Thus the entire process can be simplified.

Second, it is not needed to use a hard mask layer having a high selectivity ratio with respect to the photoresist due to reduced thickness of the photoresist, because the line width of the photoresist is decreased at the same time in etching the hard mask layer without using a separate process for reducing the line width of the photoresist. It is also possible to prevent defects of the hard mask layer pattern formed by using the photoresist as a mask.

It will be apparent to those skilled in the art that various modifications and variations can be made in the method of forming a micro pattern of semiconductor devices according to the present invention without departing from the spirit or scope of the invention. Thus, it is intended that the present invention cover the modifications and variations of this invention provided they come within the scope of the appended claims and their equivalents.

What is claimed is:

1. A method of forming a micro pattern of a semiconductor device, comprising:

forming a hard mask layer on a micropatternable layer;

depositing and patterning a photoresist on the hard mask layer to form a photoresist pattern having a first line width;

etching the photoresist pattern and the hard mask layer during a single etching step to form a hard mask layer pattern having a second line width that is smaller than the first line width; and etching the micropatternable layer using the hard mask layer pattern as a mask to form a micro pattern.

2. The method as claimed in claim 1, wherein an etching gas used to etch the photoresist pattern and the hard mask layer pattern is a mixture gas of $CF_4$, $CHF_3$ and Ar.

3. The method as claimed in claim 2, wherein approximately 10 to 50% of $CF_4$ with respect to $CHF_3$ is used.

4. The method as claimed in claim 1, wherein the step of etching the photoresist pattern and the hard mask layer is done with a source power of approximately 1000 to 2500 W.

5. The method as claimed in claim 1, wherein the step of etching the photoresist pattern and the hard mask layer is done with a bias power of approximately 200 to 1000 W.

6. The method as claimed in claim 1, wherein the step of etching the photoresist pattern and the hard mask layer is done in a chamber where the chamber pressure is approximately 1 to 10 mT.

7. The method as claimed in claim 1, wherein the step of etching the photoresist pattern and the hard mask layer is done in a chamber where the chamber temperature is approximately −10 to 50° C.

8. The method as claimed in claim 1, wherein the hard mask layer is either silicon oxide layer or silicon nitride layer.

9. The method as claimed in claim 1, wherein etching equipment used to form the hard mask layer pattern having a line width smaller than that of the photoresist pattern is at least one of reactive ion etcher (RIE), magnetically enhanced reactive ion etcher (MERIE) and high density plasma etcher (HDP).

10. A method of forming a hard mask layer pattern, comprising:
    forming a hard mask layer;
    depositing a photoresist layer on the hard mask layer;
    patterning the photoresist layer to form a photoresist pattern having a first line width; and
    simultaneously etching the photoresist pattern and the hard mask layer to remove a portion of the photoresist pattern and a portion of the hard mask layer to thereby form a hard mask layer pattern with a second line width, wherein the second line width is smaller than the first line width.

11. The method as claimed in claim 10, wherein an etching gas used to simultaneously etch the photoresist pattern and the hard mask layer pattern is a mixture of $CF_4$, $CHF_3$ and Ar.

12. The method as claimed in claim 11 wherein the etching gas comprises 10 to 50% of $CF_4$ with respect to $CHF_3$.

13. The method as claimed in claim 10, wherein the simultaneous etching is done with a source power of approximately 1000 to 2500 W.

14. The method as claimed in claim 10, wherein the simultaneous etching is done with a bias power of approximately 200 to 1000 W.

15. The method as claimed in claim 10, wherein the simultaneous etching is done in a chamber where the chamber pressure is approximately 1 to 10 mT.

16. The method as claimed in claim 10, wherein the simultaneous etching is done in a chamber where the chamber temperature is approximately −10 to 50° C.

17. The method as claimed in claim 10, wherein the simultaneous etching is performed using at least one of a reactive ion etcher (RIE), a magnetically enhanced reactive ion etcher (MERIE) and a high density plasma etcher (HDP).

18. The method as claimed in claim 10, wherein the patterning step results in a photoresist pattern having a first line width of about 0.25 $\mu$m.

19. The method as claimed in claim 10, wherein the second line width is no greater than approximately 0.1 $\mu$m.

20. The method as claimed in claim 10, further comprising removing the remaining portions of the photoresist pattern after the simultaneous etching step has been performed.

* * * * *